United States Patent [19]

Gorczyca et al.

[11] Patent Number: 5,161,093
[45] Date of Patent: Nov. 3, 1992

[54] MULTIPLE LAMINATION HIGH DENSITY INTERCONNECT PROCESS AND STRUCTURE EMPLOYING A VARIABLE CROSSLINKING ADHESIVE

[75] Inventors: Thomas B. Gorczyca, Schenectady; Stanton E. Weaver, Jr., Northville; Robert J. Wojnarowski, Ballston Lake, all of N.Y.

[73] Assignee: General Electric Company, Schenectady, N.Y.

[21] Appl. No.: 546,959

[22] Filed: Jul. 2, 1990

[51] Int. Cl.$^5$ ............................................. H05K 1/11
[52] U.S. Cl. .................................................. 361/414
[58] Field of Search ................. 29/827, 831, 846, 851, 29/856; 174/250, 259, 260, 261; 357/68, 69, 71, 80, 65, 54, 52; 361/397, 400, 401, 409, 411, 414; 439/34.7, 35.8; 428/209, 413, 901

[56] References Cited

U.S. PATENT DOCUMENTS

| | | |
|---|---|---|
| 4,246,595 | 1/1981 | Hoyori et al. .......................... 357/69 |
| 4,783,695 | 11/1988 | Eichelberger et al. ................ 357/65 |
| 4,884,122 | 11/1989 | Eichelberger et al. ................ 357/71 |
| 5,073,814 | 12/1991 | Cole, Jr. et al. ....................... 357/71 |
| 5,108,825 | 4/1992 | Wojnarowski et al. ............. 428/209 |

FOREIGN PATENT DOCUMENTS

| | | |
|---|---|---|
| 0222144 | 5/1987 | European Pat. Off. . |
| 0310010 | 4/1989 | European Pat. Off. . |
| 1171655 | 11/1969 | United Kingdom . |

*Primary Examiner*—Leo P. Picard
*Assistant Examiner*—D. Sparks
*Attorney, Agent, or Firm*—Marvin Snyder

[57] ABSTRACT

A high density interconnect structure incorporating a plurality of laminated dielectric layers is fabricated using a SPI/epoxy crosslinking copolymer blend adhesive in order to maintain the stability of the already fabricated structure during the addition of the later laminations while also maintaining the repairability of the high density interconnect structure.

19 Claims, 5 Drawing Sheets

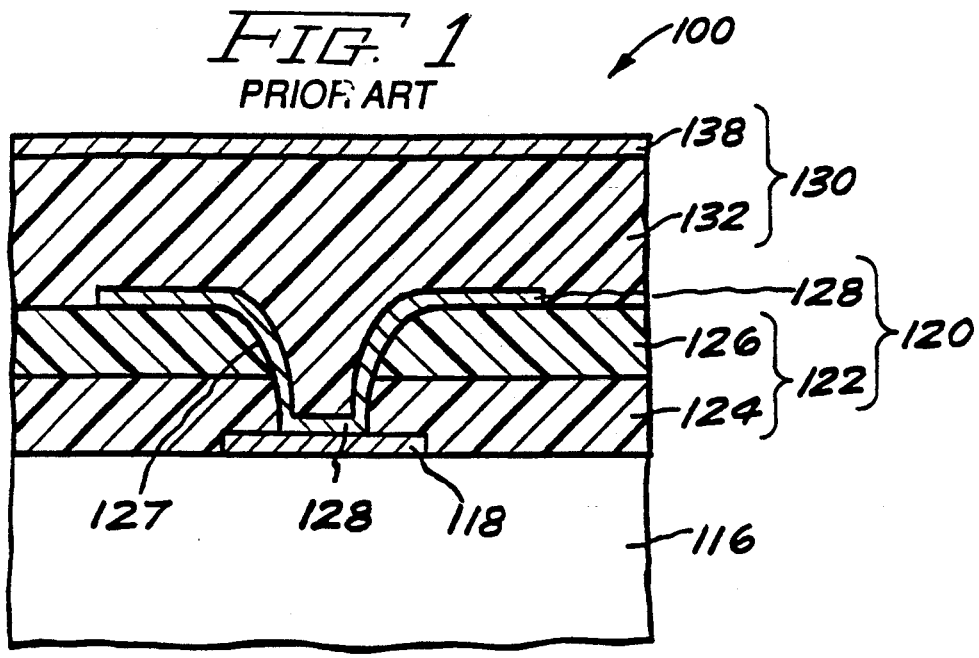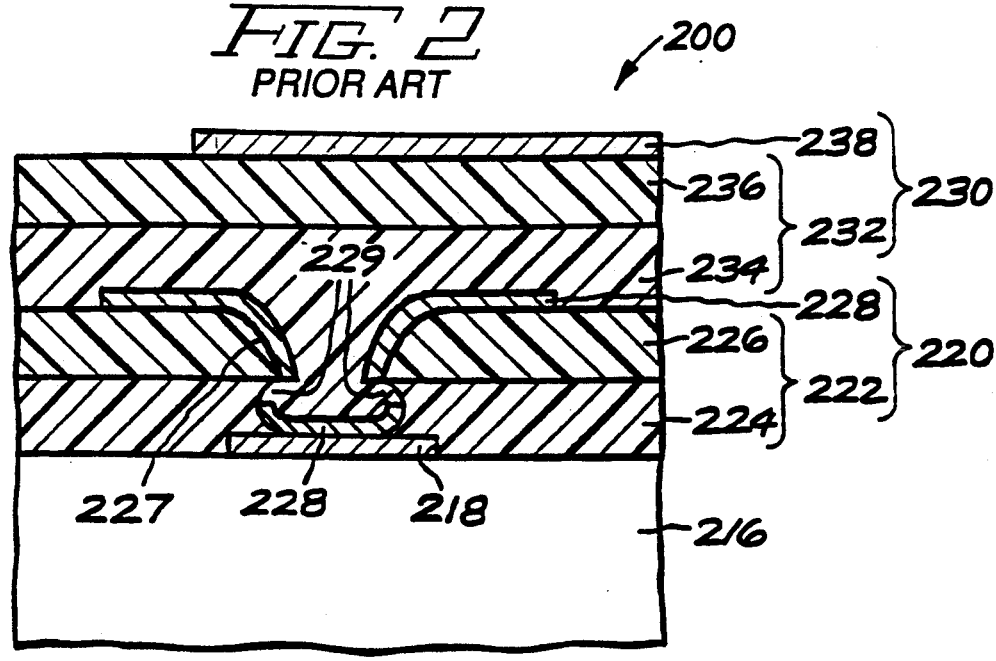

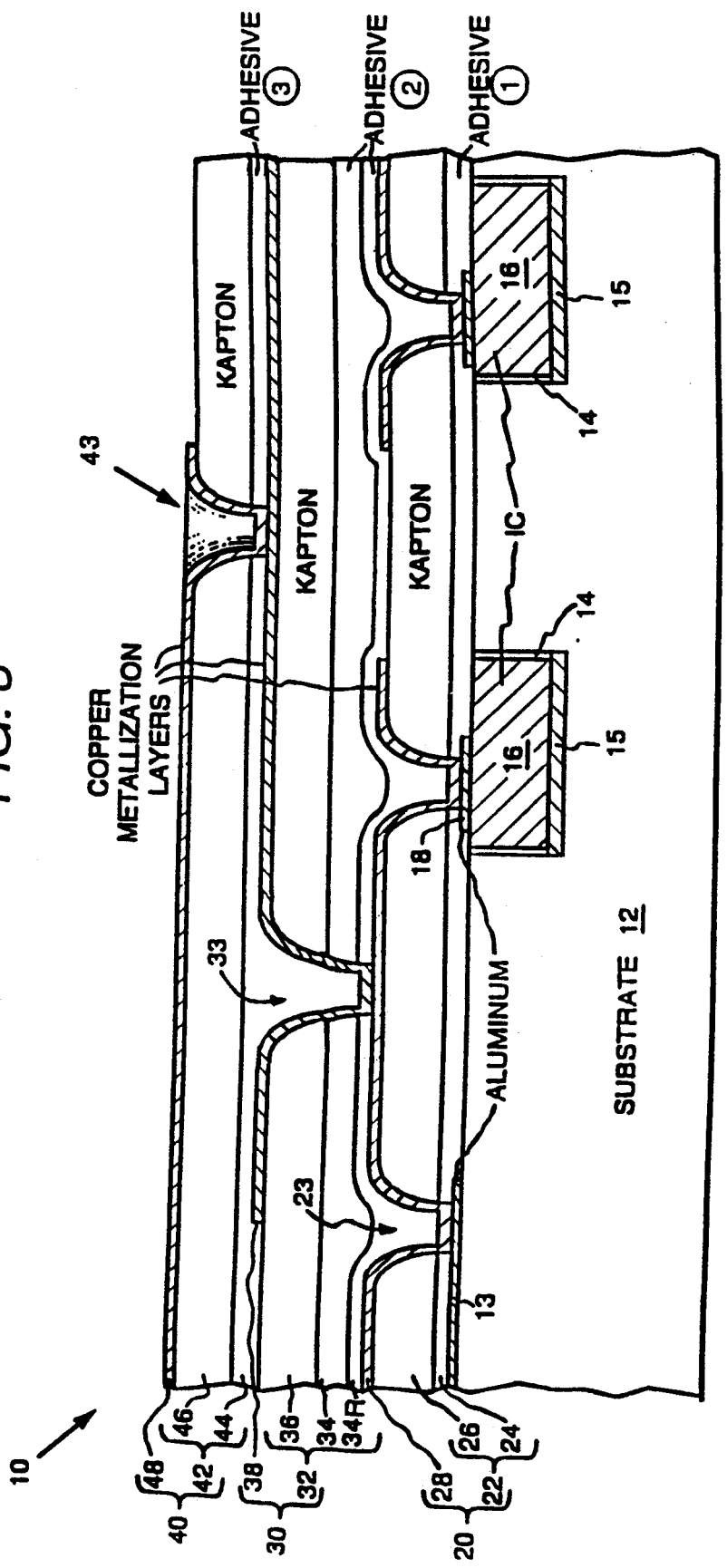

401: MOUNT CHIPS ON SUBSTRATE

402: COAT FIRST DIELECTRIC FILM WITH AN APPROPRIATE THERMOPLASTIC ADHESIVE HAVING $T_{g1}$

403: LAMINATE FIRST DIELECTRIC FILM TO CHIPS AT TEMPERATURE $T_1$

404: FORM VIA HOLES IN FIRST DIELECTRIC LAYER

405: FORM PATTERNED METALLIZATION ON FIRST DIELECTRIC LAYER

406: COAT EXISTING STRUCTURE WITH A THERMOPLASTIC RELEASE LAYER AND DRY THAT LAYER

407: APPLY A COATING OF A SPI/EPOXY COPOLYMER BLEND AS THE LOWER SUBLAYER OF THE SECOND DIELECTRIC LAYER

408: DRY SECOND, SPI/EPOXY COPOLYMER BLEND, LOWER SUBLAYER AT TEMPERATURE $T_2$

409: PRETREAT SECOND UPPER SUBLAYER

410: LAMINATE SECOND UPPER SUBLAYER DIELECTRIC FILM TO SECOND LOWER SUBLAYER AT TEMPERATURE $T_3$

411: FORM VIA HOLES IN SECOND DIELECTRIC LAYER

412: FORM PATTERNED METALLIZATION ON SECOND DIELECTRIC LAYER

413: COAT EXISTING STRUCTURE WITH A THIRD THERMOSETTING ADHESIVE LOWER SUBLAYER

414: DRY THIRD, THERMOSETTING ADHESIVE, LOWER SUBLAYER AT TEMPERATURE $T_2$

415: PRETREAT THIRD UPPER SUBLAYER FILM AND LAMINATE IT TO THIRD LOWER SUBLAYER AT TEMPERATURE $T_3$

416: FORM VIA HOLES IN THIRD DIELECTRIC LAYER

417: FORM PATTERNED METALLIZATION ON THIRD DIELECTRIC LAYER

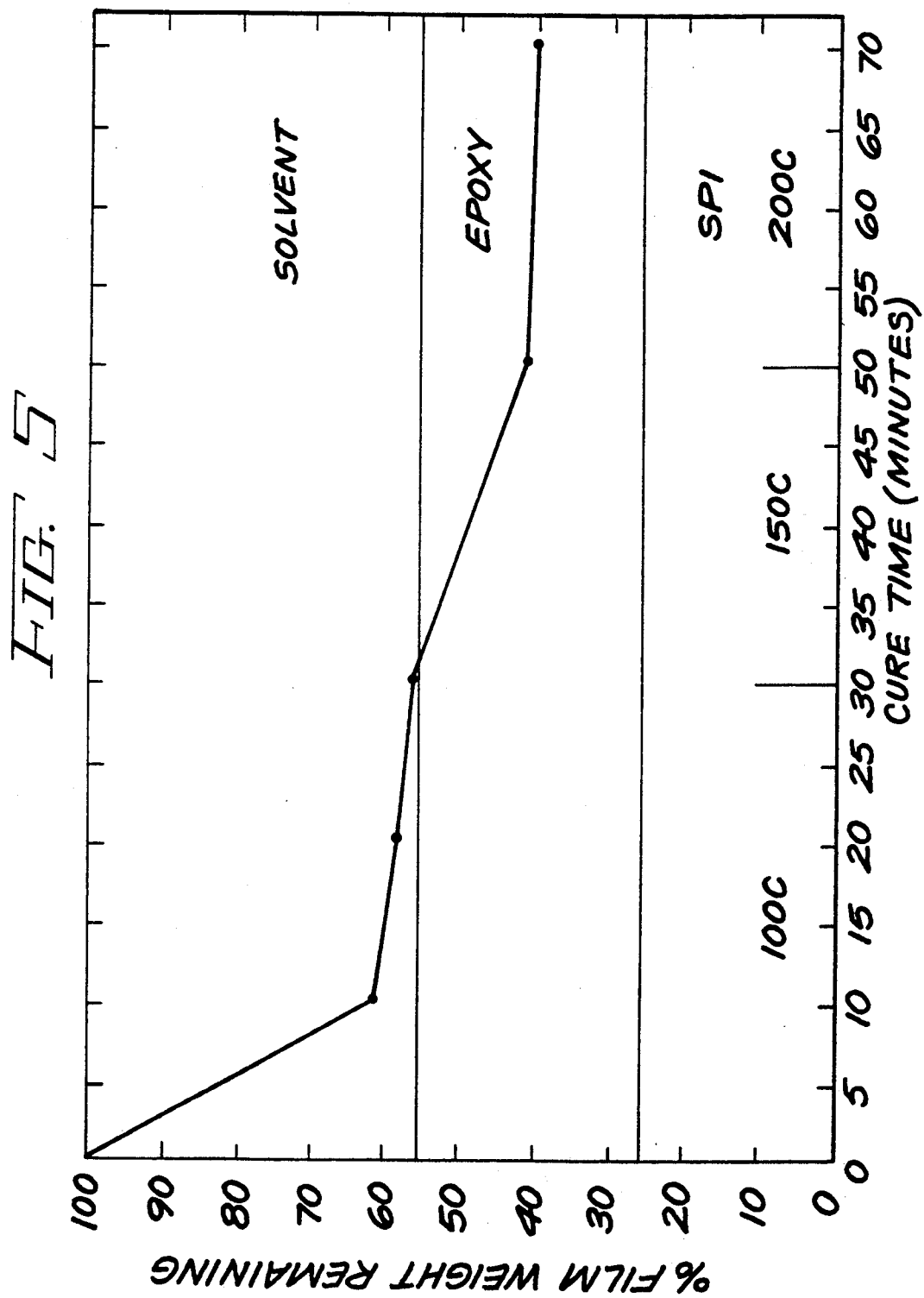

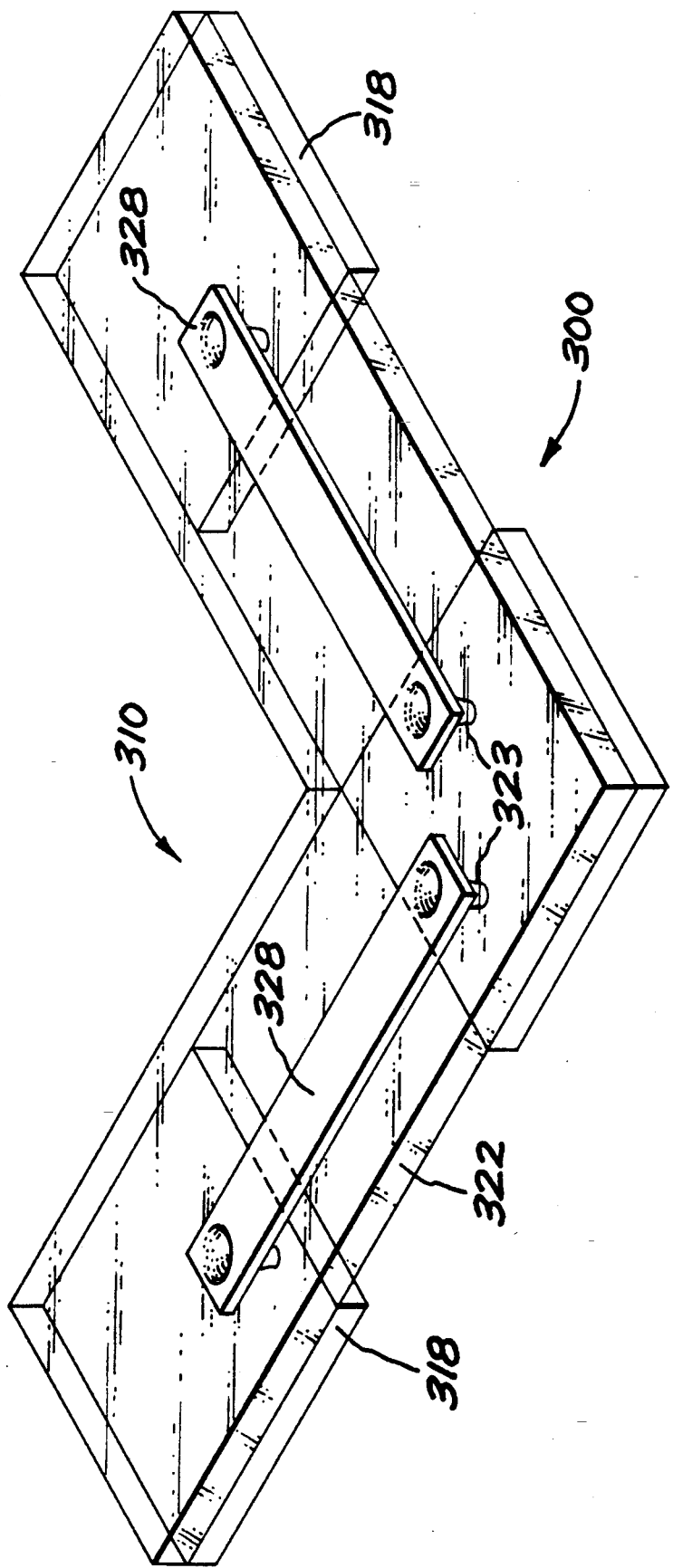

MULTIPLE LAMINATION HIGH DENSITY INTERCONNECT PROCESS AND STRUCTURE EMPLOYING A VARIABLE CROSSLINKING ADHESIVE

RELATED APPLICATIONS

This application is related to application Ser. No. 07/546,966 filed Jul. 2, 1990, entitled "Multiple Lamination High Density Interconnect Process and Structure Employing Thermoplastic Adhesives Having Sequentially Decreasing Tg's" by H. S. Cole et al.; application Ser. No. 07/546,965, entitled "A High Density Interconnect Structure Including a Spacer Structure and a Gap", by H. S. Cole et al. and application Ser. No. 07/546,964, filed Jul. 2, 1990, entitled "High Temperature Polyether Imide Compositions and Method of Making" by J. H. Lupinski et al., each of which is incorporated herein by reference in its entirety.

BACKGROUND OF THE INVENTION

1. Field of the Invention

The present invention relates to the field of high density interconnect structures for interconnecting electronic components, and more particularly, to such structures employing more than one layer of conductors.

2. Background Information

A high density interconnect (HDI) structure or system which has been developed by General Electric Company offers many advantages in the compact assembly of electronic systems. For example, an electronic system such as a micro computer which incorporates 30–50 chips can be fully assembled and interconnected on a single substrate which is 2 inch long by 2 inch wide by 0.050 inch thick. Even more important, this interconnect structure can be disassembled for repair or replacement of a faulty component and then reassembled without significant risk to the good components incorporated within the system. This is particularly important where as many as 50 chips having a cost of as much as $2,000.00, each, may be incorporated in a single system on one substrate. This repairability is a substantial advance over prior connection systems in which reworking the system to replace damaged components was either impossible or involved substantial risk to the good components.

Briefly, in this high density interconnect structure, a ceramic substrate such as alumina which may be 100 mils thick and of appropriate size and strength for the overall system, is provided. This size is typically less than 2 inches square, but may be made larger or smaller. Once the position of the various chips has been specified, individual cavities or one large cavity having appropriate depth at the intended locations of differing chips, is prepared. This may be done by starting with a bare substrate having a uniform thickness and the desired size. Conventional, ultrasonic or laser milling may be used to form the cavities in which the various chips and other components will be positioned. For many systems where it is desired to place chips nearly edge-to-edge, a single large cavity is satisfactory. That large cavity may typically have a uniform depth where the semiconductor chips have a substantially uniform thickness. Where a particularly thick or a particularly thin component will be placed, the cavity bottom may be made respectively deeper or shallower to place the upper surface of the corresponding component in substantially the same plane as the upper surface of the rest of the components and the portion of the substrate which surrounds the cavity. The bottom of the cavity is then provided with a thermoplastic adhesive layer which may preferably be polyetherimide resin available under the trade name ULTEM ® 6000 from the General Electric Company. The various components then placed in their desired locations within the cavity, the entire structure is heated to about 300° C. which is above the softening point of the ULTEM ® polyetherimide (which is in the vicinity of 235° C.) and then cooled to thermoplastically bond the individual components to the substrate. Thereafter, a polyimide film which may be Kapton ® polyimide, available from E. I. du Pont de Nemours Company, which is ≈0.0005–0.003 inch (≈12.5–75 microns) thick is pretreated to promote adhesion by reactive ion etching (RIE), the substrate and chips are then coated with ULTEM ® 1000 polyetherimide resin or another thermoplastic and the Kapton film is laminated across the top of the chips, any other components and the substrate with the ULTEM ® resin serving as a thermoplastic adhesive to hold the Kapton ® in place. Thereafter, via holes are provided (preferably by laser drilling) in the Kapton ® and ULTEM ® layers in alignment with the contact pads on the electronic components to which it is desired to make contact. A metallization layer which is deposited over the Kapton ® layer extends into the via holes and makes electrical contact to the contact pads disposed thereunder. This metallization layer may be patterned to form individual conductors during the process of depositing it or may be deposited as a continuous layer and then patterned using photoresist and etching. The photoresist is preferably exposed using a laser to provide an accurately aligned conductor pattern at the end of the process. Alternatively, exposure through a mask may be used.

Additional dielectric and metallization layers are provided as required in order to provide all of the desired electrical connections among the chips. Any misposition of the individual electronic components and their contact pads is compensated for by an adaptive laser lithography system which is the subject of some of the Patents and Applications which are listed hereinafter.

This high density interconnect structure provides many advantages. Included among these are the lightest weight and smallest volume packaging of such an electronic system presently available. A further, and possibly more significant advantage of this high density interconnect structure, is the short time required to design and fabricate a system using this high density interconnect structure. Prior art processes require the prepackaging of each semiconductor chip, the design of a multilayer circuit board to interconnect the various packaged chips, and so forth. Multilayer circuit boards are expensive and require substantial lead time for their fabrication. In contrast, the only thing which must be specially pre-fabricated for the HDI system is the substrate on which the individual semiconductor chips will be mounted. This substrate is a standard stock item, other than the requirement that the substrate have appropriate cavities therein for the placement of the semiconductor chips so that the interconnect surface of the various chips and the substrate will be in a single plane. In the HDI process, the required cavities may be formed in an already fired ceramic substrate by conventional or laser milling. This milling process is straightforward and fairly rapid with the result that once a desired configuration for the substrate has been established, a corresponding physical substrate can be made ready for the mounting of the semiconductor chips in as little as 1 day and typically 4 hours for small quantities as are suitable for research or prototype systems to confirm the design prior to quantity production.

The process of designing an interconnection pattern for interconnecting all of the chips and components of an electronic system on a single high density interconnect substrate normally takes somewhere between one week and five weeks. Once that interconnect structure has been defined, assembly of the system on the substrate may begin. First, the chips are mounted on the substrate and the overlay structure is built-up on top of the chips and substrate, one layer at a time. Typically, the entire process can be finished in one day and in the event of a high priority rush, could be completed in four hours. Consequently, this high density interconnect structure not only results in a substantially lighter weight and more compact package for an electronic system, but enables a prototype of the system to be fabricated and tested in a much shorter time than is required with other packaging techniques.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. patent application Ser. No. 249,927, filed Sep. 27, 1989, entitled "Method and Apparatus for Removing Components Bonded to a Substrate" by R. J. Wojnarowski, et al.; U.S. patent application Ser. No. 310,149, filed Feb. 14, 1989, entitled "Laser Beam Scanning Method for Forming Via Holes in Polymer Materials" by C. W. Eichelberger, et al.; U.S. patent application Ser. No. 312,798, filed Feb. 21, 1989, entitled "High Density Interconnect Thermoplastic Die Attach Material and Solvent Die Attachment Processing" by R. J. Wojnarowski, et al.; U.S. patent application Ser. No. 283,095, filed Dec. 12, 1988, entitled "Simplified Method for Repair of High Density Interconnect Circuits" by C. W. Eichelberger, et al.; U.S. patent application Ser. No. 305,314, filed Feb. 3, 1989, entitled "Fabrication Process and Integrated Circuit Test Structure" by H. S. Cole, et al.; U.S. patent application Ser. No. 250,010, filed Sep. 27, 1988, entitled "High Density Interconnect With High Volumetric Efficiency" by C. W. Eichelberger, et al.; U.S. patent application Ser. No. 329,478, filed Mar. 28, 1989, entitled "Die Attachment Method for Use in High Density Interconnected Assemblies" by R. J. Wojnarowski, et al.; U.S. patent application Ser. No. 253,020, filed Oct. 4, 1988, entitled "Laser Interconnect Process" by H. S. Cole, et al.; U.S. patent application Ser. No. 230,654, filed Aug. 5, 1988, entitled "Method and Configuration for Testing Electronic Circuits and Integrated Circuit Chips Using a Removable Overlay Layer" by C. W. Eichelberger, et al.; U.S. patent application Ser. No. 233,965, filed Aug. 8, 1988, entitled "Direct Deposition of Metal Patterns for Use in Integrated Circuit Devices" by Y. S. Liu, et al.; U.S. patent application Ser. No. 237,638, filed Aug. 23, 1988, entitled "Method for Photopatterning Metallization Via UV Laser Ablation of the Activator" by Y. S. Liu, et al.; U.S. patent application Ser. No. 237,685, filed Aug. 25, 1988, entitled "Direct Writing of Refractory Metal Lines for Use in Integrated Circuit Devices" by Y. S. Liu, et al.; U.S. patent application Ser. No. 240,367, filed Aug. 30, 1988, entitled "Method and Apparatus for Packaging Integrated Circuit Chips Employing a Polymer Film Overlay Layer" by C. W. Eichelberger, et al.; U.S. patent application Ser. No. 342,153, filed Apr. 24, 1989, entitled "Method of Processing Siloxane-Polyimides for Electronic Packaging Applications" by H. S. Cole, et al.; U.S. patent application Ser. No. 289,944, filed Dec. 27, 1988, entitled "Selective Electrolytic Deposition on Conductive and Non-Conductive Substrates" by Y. S. Liu, et al.; U.S. patent application Ser. No. 312,536, filed Feb. 17, 1989, entitled "Method of Bonding a Thermoset Film to a Thermoplastic Material to Form a Bondable Laminate" by R. J. Wojnarowski; U.S. patent application Ser. No. 363,646, filed Jun. 8, 1989, entitled "Integrated Circuit Packaging Configuration for Rapid Customized Design and Unique Test Capability" by C. W. Eichelberger, et al.; U.S. patent application Ser. No. 07/459,844, filed Jan. 2, 1990, entitled "Area-Selective Metallization Process" by H. S. Cole, et al.; U.S. patent application Ser. No. 07/457,023, filed Dec. 26, 1989, entitled "Locally Orientation Specific Routing System" by T. R. Haller, et al.; U.S. patent application Ser. No. 456,421, filed Dec. 26, 1989, entitled "Laser Ablatable Polymer Dielectrics and Methods" by H. S. Cole, et al.; U.S. patent application Ser. No. 454,546, filed Dec. 21, 1989, entitled "Hermetic High Density Interconnected Electronic System" by W. P. Kornrumpf, et al.; U.S. patent application Ser. No. 07/457,127, filed Dec. 26, 1989, entitled "Enhanced Fluorescence Polymers and Interconnect Structures Using Them" by H. S. Cole, et al.; U.S. patent application Ser. No. 454,545, filed Dec. 21, 1989, entitled "An Epoxy/Polyimide Copolymer Blend Dielectric and Layered Circuits Incorporating It" by C. W. Eichelberger, et al.. application Ser. No. 07/504,760, filed Apr. 5, 1990, entitled, "A Building Block Approach to Microwave Modules", by W. P. Kornrumpf et al.; application Ser. No. 07/504,821, filed Apr. 5, 1990, entitled, "HDI Microwave Circuit Assembly", by W. P. Kornrumpf, et al.; application Ser. No. 07/504,750 filed Apr. 5, 1990, entitled, "An Ultrasonic Array With a High Density of Electrical Connections", by L. S. Smith, et al.; application Ser. No. 07/504,803, filed Apr. 5, 1990, entitled, "Microwave Component Test Method and Apparatus", by W. P. Kornrumpf, et al.; application Ser. No. 07/504,753, filed Apr. 5, 1990, entitled, "A Compact High Density Interconnected Microwave System", by W. P. Kornrumpf; application Ser. No. 07/504,769, filed Apr. 5, 1990, entitled, "A Flexible High Density Interconnect Structure and Flexibly Interconnected System" by C. W. Eichelberger, et al.; application Ser. No. 07/504,751, filed Apr. 5, 1990, entitled, "Compact, Thermally Efficient Focal Plane Array and Testing and Repair Thereof", by W. P. Kornrumpf, et al.; application Ser. No. 07/504,749, filed Apr. 5, 1990, entitled, "High Density Interconnect Structure with Top Mounted Components", by R. J. Wojnarowski, et al.; application Ser. No. 07/504,770, filed Apr. 5, 1990, entitled, "A High Density Interconnect Structure Including a Chamber", by R. J. Wojnarowski, et al.; and application Ser. No. 07/504,748, filed Apr. 5, 1990, entitled, "Microwave Component Having Tailored Operating Characteristics and Method of Tailoring" by W. P. Kornrumpf, et al. Each of these Patents and Patent Applications is incorporated herein by reference.

Any additional dielectric layers which are required for isolation between the first metallization layer and any subsequent metallization layers or for prevention of short circuits due to contact with external conductors are formed by spinning on or spraying on a solvent solution of a desired thermoplastic dielectric material. The structure is then baked to drive off the solvent in order to leave a solvent-free dielectric layer. Alternatively, in accordance with U.S. patent application Ser. No. 454,545, entitled, "An Epoxy/Polyimide Copolymer Blend Dielectric and Layered Circuits Incorporating It" a siloxane-polyimide/epoxy blend may be spun-on, dried and cured to provide this dielectric layer. Thereafter, via holes are formed as needed and a patterned metallization layer is formed thereover which is disposed in ohmic contact with underlying metal in the via holes. If needed, further dielectric and metallization layers are formed thereover in a similar manner. Unfortunately, there are a limited number of dielectric materials which are suitable for use as these upper dielectric layers because of all of the material properties they must exhibit. Not only must the dielectric material be available as a spin-on or spray-on solution, it must also provide good adhesion to the underlying dielectric and metallization and to the material of any overlying metallization or dielectric layer which may subsequently be formed thereon and it should be inherently laser ablatable or it should be rendered laser ablatable in accordance with U.S. patent application Ser. No. 456,421, entitled, "Laser Ablatable Polymer Dielectrics and Methods".

By a thermoplastic polymer material, we mean a polymer material which after multiple cycles of heating and cooling substantially retains its initial melting point or glass transition temperature. That is, no substantial cross-linking of the material takes place during the heating, melting and resolidification process. Such polymers are suitable as adhesive layers for bonding higher temperature materials, including polymers to substrates and may also themselves be used as layers to be bonded to substrates through the use of lower temperature adhesive layers. The glass transition temperature of a polymer is the temperature above which the viscosity of the polymer decreases greatly, thereby allowing the polymer to flow and also to bond to other materials. When cooled below this glass transition temperature, the thermoplastic polymer "resolidifies" and remains adherent to objects with which it is in intimate contact. By a thermoset polymer material, we mean a polymer material in which cross-linking takes place the first time it is heated or during its preparation process, such that the material either no longer melts or melts at a much higher temperature than it did prior to its initial heating or its formation, as the case may be.

While the use of spin-on or spray-on dielectric layers for the second and higher dielectric layers of a high density interconnect structure is effective, it has a number of potential drawbacks and process complications. In particular, such dielectric layers must be baked to drive off their solvent. The baking time and temperature profiles involved can adversely affect some electronic components. Further, in some situations, there is poor adhesion between adjacent dielectric layers. In other situations, excessive stress in the dielectric layers or at the interface between adjacent dielectric layers can adversely affect the quality and reliability of a high density interconnect structure. During the coating of further dielectric layers, the solvent vehicle tends to redissolve the surface portion of an already formed, unreacted, thermoplastic dielectric layer on which it is disposed. While this tends to improve adhesion, it can also result in excessive interfacial stress and cracking or crazing of the dielectric layers which renders the structure unusable.

There are known techniques for using thermoset materials as adhesives in the formation of multilayer printed circuit boards. These include spinning on a precursor of a thermoset material and reacting it in place to form a thermoset dielectric layer. Once such a layer has reacted, it is no longer soluble in the solvent which is used in forming the next layer with the result that damage to underlying layers does not occur during the formation of subsequent layers. Such materials are available from Sheldahl Corporation.

Another thermoset technique is the type of laminate used in making laminated circuit boards. These include the copper dielectric laminate available under the trademark Pyrolux ® from Dupont. These systems use acrylate adhesives which become thermoset at a curing temperature of about 135° C. Unfortunately, acrylate adhesives are not considered sufficiently thermally stable for use in most high density interconnect structures of the type to which the present invention is directed and once reacted generally don't solvent at all. In particular, it is considered desirable to be able to operate these high density interconnect structure systems in the vicinity of 200° C. or higher. Acrylates are not considered usable above 150° C. Epoxies also exhibit thermal instabilities which prevent their use at these temperatures. In particular, most epoxies turn tan at 150° C. and turn black at 180° C.

Printed circuit boards made by either of these techniques cannot be disassembled for repair and most of those printed circuit boards which are faulty must be discarded. Printed circuit boards of whatever type are fully tested prior to mounting expensive components thereon. Consequently, expensive chips are not committed to faulty printed circuit boards. While this lack of repairability is a disadvantage, it is more than offset for printed circuit board applications by the combination of relatively high testing yield and the high durability the thermoset structure imparts to the circuit board.

While use of a thermoset structure is beneficial in the printed circuit board art, the use of such thermoset systems is unacceptable in a high density interconnect structure of the type to which this invention is directed because the expensive chips are put in place before the interconnection structure is built. As a result, any fault in a thermoset high density interconnect structure would require scrapping not only of the interconnection structure itself, but all of the chips as well. Thus, the conversion of a high density interconnect structure of the type described above into one having a thermoset structure is not considered a solution to the problems associated with the formation of multilayered high density interconnect structures.

The use of multiple thermoset dielectric layers which are laminated to the structure using a thermoplastic adhesive to provide such a multilayer structure in which each dielectric layer includes a thermoset upper sublayer and a thermoplastic lower sublayer as discussed in U.S. Pat. No. 4,783,695 has not been implemented because of the tendency for the early laminated layers to shift, deform or otherwise change during the lamination of subsequent layers in a way which breaks via connections between layers. Consequently, an alternative process for providing additional dielectric layers is desirable.

A further problem which we have found in packaging completed, fully tested high density interconnect structures is a development of inter-layer short circuits during the packaging process in which force is applied to the top of the high density interconnect structure in order to provide an adequate bond between the package base and the high density interconnect structure substrate. We have determined that these short circuits are a result of the soft or pliable nature of the spun-on dielectric layers used for the second and subsequent dielectric layers in those structures which results in shifting of the dielectric and the creation of short circuits. This means that the circuits are not as rugged as desired and also means that thickness of the dielectric layers is not stable at least in the vicinity of some of the conductor runs or particular conductor patterns. This raises an additional concern for microwave applications of this structure because of the need in such structures to provide a known, fixed dielectric layer thickness in order to provide transmission lines with their intended impedances in order that the structure will exhibit its intended microwave performance. Thus, there is a need for an improved process and high density interconnect structure configuration which eliminates or minimizes these problems.

This problem should be at least partially solved by the multiple lamination process taught in related application Ser. No. 07/546,936, entitled, "Multiple Lamination High Density Interconnect Process and Structure Employing Thermoplastic Adhesives having Sequentially Decreasing Tg's", since that process provides a thermoset or high temperature thermoplastic laminated layer over each metallization layer. Those high temperature layers should solve the problem of short circuits. However, that structure does not eliminate the problem of shifting and/or changing thicknesses of the thermoplastic portions of that structure. Further, the use of multiple $T_g$ adhesive layer could potentially aggravate the problem of thermoplastic shift because of the use of successively lower $T_g$ materials in multilayer structures.

Consequently, there is a need for a further improvement in such high density interconnect structures which retains their repairability while improving their durability.

OBJECTS OF THE INVENTION

Accordingly, a primary object of the present invention is to provide laminated upper layer dielectrics in a high density interconnect structure by a process which avoids baking of the structure at temperatures in excess of 200° C.

Another object of the present invention is to provide a repairable high density interconnect structure incorporating layers laminated with crosslinking adhesives.

Another object of the present invention is to provide a planar multi-laminated high density interconnect structure whose fabrication avoids the problem of via interconnection destruction during fabrication.

Another object of the present invention is to provide a planar multi-laminated high density interconnect structure which is free of materials having low tolerances for x-ray and gamma ray radiation.

Another object of the present invention is to provide a planar multi-laminated high density interconnect structure which is substantially immune to the creation of short circuits and to changes in dielectric layer thicknesses when reasonable forces are applied to the upper surface of the structure during packaging or for other reasons.

Another object of the present invention is to provide greater versatility and variety in high density interconnect structures, the materials of which they are fabricated and the processes for fabricating them.

Another object of the present invention is to enable an overall high density interconnect structure to be used to interconnect a plurality of pretested, basic high density interconnect structures to form more complex systems.

Another object of the present invention is to provide passivation of a high density interconnect structure with multiple Kapton layers.

SUMMARY OF THE INVENTION

The above and other objects which will become apparent from the specification as a whole, including the drawings, are accomplished in accordance with the present invention by using multiple laminations to provide the dielectric layers in a high density interconnect structure through use of an adhesive for the different laminating steps which becomes sufficiently set before the next laminating step that the already fabricated structure is unaffected by the subsequent laminating steps even when all of these upper layer laminations are carried out at the same lamination temperature.

In accordance with one embodiment of the invention, a base high density interconnect structure is fabricated by laminating a first dielectric film over the electronic components using a first thermoplastic adhesive having a first glass transition temperature $T_{g1}$, forming via holes in that dielectric layer in alignment with the contact pads to which contact is to be made and forming a patterned metallization layer on top of that first dielectric layer. Other methods of forming this base high density interconnect structure may also be used. The invention proceeds with spinning on a thermoplastic release sublayer on top of the metallization layer and the exposed portions of the dielectric layer of this base structure in a manner to at least partially fill the via holes to provide a thermally releasing release layer in the lower portion of the vias in that first metallization layer. This is followed by spinning on a variable crosslinking adhesive on top of the release layer to fill-in between conductors of the metallization pattern to provide a substantially planar surface, drying that crosslinking adhesive to a solvent-free condition and laminating a second dielectric film to the structure with that crosslinking adhesive layer serving as the adhesive. That lamination being done under conditions in which that adhesive finishes curing. This second lamination step is preferably carried out at a lamination temperature which is less than $T_{g1}$ to provide lamination conditions which protect via connections between the first metallization layer and contact pads on the electronic components from destruction and other adverse effects. The release layer is provided so that the high density interconnect structure can be peeled off the underlying structure at an elevated temperature without the crosslinking adhesive pulling divots from the underlying contact pads. After completion of the second lamination step, via holes are formed in the second dielectric layer in alignment with conductors to which it is desired to form electrical contacts. These conductors may be conductors of the first metallization layer or contact pads of the electronic components. A second metallization layer is then formed over the second dielectric layer and patterned appropriately. If more conductive layers are required, additional dielectric films may be laminated to the structure with the same adhesive (without need for the release layer) and appropriate conductive layers may be formed thereover. This enables any desired number of conductive layers to be provided without reducing the maximum operating temperature of the system.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 1 is a schematic cross-section view of a typical first level via connection in a prior art high density interconnect structure having spun-on thermoplastic upper dielectric layers;

FIG. 2 is a schematic cross-section view of a broken via connection in a multi-laminate structure employing a thermoplastic adhesive;

FIG. 3 is a cross-section view of a high density interconnect structure in accordance with the present invention;

FIG. 4 is an illustration of the process steps involved in fabrication of the FIG. 3 structure;

FIG. 5 is a graph of the drying/curing process for a preferred thermosetting adhesive; and FIG. 6 is a perspective schematic illustration of a plurality of separate basic high density interconnect structures in accordance with the present invention which are interconnected by an overall high density interconnect structure which includes a dielectric layer laminated to the various ones of the basic high density interconnect structures.

DETAILED DESCRIPTION

In FIG. 1, a small portion 100 of a prior art high density interconnect structure which includes a first level via connection is illustrated in cross-section. This high density interconnect structure includes a laminated first dielectric layer 122 and a spun-on second dielectric layer 132. This structure comprises a chip 116 having a contact pad 118 on its upper surface. A first layer 120 of the overlying high density interconnect structure comprises a dielectric layer 122 and a patterned metallization layer 128. The dielectric layer 122 has separate lower and upper sublayers 124 and 126, respectively. The sublayer 124 is a thermoplastic adhesive such as ULTEM ® 1000 polyetherimide resin available from General Electric Company and the sublayer 126 is a Kapton ® polyimide thermoset film, available from E. I. du Pont de Nemours Company. The metallization 128 extends down into a via hole 127 and into ohmic contact with the contact pad 118. The sidewalls of the via hole are sloped upward and outward as a result of its formation by laser drilling. A second layer 130 of the high density interconnect structure is disposed on layer 120 and comprises a dielectric layer 132 and a patterned metallization layer 138. The dielectric layer 132 is a spun-on thermoplastic layer such as SPI siloxane polyimide available from MicroSi.

For failure analysis we cross-sectioned multilayer laminates which we made previously in which each dielectric layer consisted of a thermoplastic lower layer and a thermoset upper layer and in which via connections were destroyed during the process of laminating subsequent dielectric layer.

FIG. 2 illustrates a small portion of such a cross-section. The cross-sectioned high density interconnect structure 200 includes laminated first and second dielectric layers 222 and 232, respectively. This structure comprises a chip 216 having a contact pad 218 on its upper surface. A first layer 220 of the overlying high density interconnect structure comprises a dielectric layer 222 and a patterned metallization layer 228. The dielectric layer 222 has separate lower and upper sublayers 224 and 226, respectively. The lower sublayer 224 is an ULTEM ®1000 polyetherimide resin available from General Electric Company thermoplastic adhesive and the upper sublayer 226 is a KAPTON ® polyimide thermoset film available from E. I. DuPont de Nemours. The metallization 228 extends down into a via hole 227 and includes a portion disposed in ohmic contact with the contact pad 218. The upper part of the sidewalls of the via hole 227 are sloped upward and outward as a result of its formation by laser drilling. A second layer 230 of the high density interconnect structure is disposed on layer 220 and comprises a dielectric layer 232 and a patterned metallization layer 238. The dielectric layer 232 has separate lower and upper sublayers 234 and 236, respectively. The lower sublayer 234 is an ULTEM ® 1000 polyetherimide resin available from General Electric Company thermoplastic adhesive and the upper sublayer 236 is a KAPTON ® polyimide thermoset film available from E. I. DuPont de Nemours.

The broken via shown in FIG. 2 is typical of broken vias we sectioned in that the via has been expanded into the space underneath the thermoset upper sublayer 226 portion of the lower dielectric layer 222. The metallization of the via is typically fractured at the lower edge of the upper sublayer 226, leaving a gap 229 in metallization 228. This post-lamination via configuration results from the thermoplastic adhesive 234 of the second dielectric layer pushing down into the via and applying side-wise pressure which causes the second adhesive 234 to flow in under the thermoset sublayer 226 of the first dielectric layer as the adhesive 234 pushes the metallization ahead of it, in underneath that thermoset sublayer 226, with the metallization in turn pushing the adhesive sublayer 224 of the first dielectric layer ahead of it. We concluded that this is a result of that second lamination being done at a temperature at which the thermoplastic adhesive of the first dielectric layer is sufficiently fluid that the pressure applied to the via sidewalls during the second lamination step can cause the first layer thermoplastic adhesive 224 to recede from the via. This problem is avoided in the prior art thermoset adhesive printed circuit board art by the thermosetting of that first adhesive layer prior to laminating the second dielectric layer. As has been discussed above, such a solution is not acceptable in high density interconnect structures of the type with which we are concerned. We therefore concluded that a solution to this problem is performing subsequent laminations at low enough temperatures and lamination pressures that the first layer thermoplastic adhesive does not flow.

A high density interconnect structure 10 in accordance with the present invention is illustrated in a cross-section view in FIG. 3. The high density interconnect structure 10 comprises a substrate 12 having cavities 14 in the upper surface thereof in which integrated circuit chips 16 or other electronic components are disposed. For many high density interconnect structures, these electronic components are bonded to the substrate with a thermoplastic adhesive 15. These electronic components have contact pads 18 on an (upper) contact surface thereof. The substrate 12 may have conductive runs 13 disposed on the upper surface thereof. A first layer 20 of the overlying high density interconnect structure 10 comprises a dielectric layer 22 and a patterned metallization layer 28. The dielectric layer 22 has separate lower and upper sublayers 24 and 26, respectively. The upper sublayer 26 may be a thermoset material or a high $T_g$ thermoplastic material. The layer 24 is a thermoplastic adhesive having a first glass transition temperature $T_{g1}$. Where the components or chips are bonded to the substrate with a thermoplastic chip adhesive 15, it is preferred that the chip adhesive have a glass transition temperature $(T_{g2})$ which is higher than $T_{g1}$.

The upper sublayer 26 of the first dielectric layer 22 should be stable over a range of temperatures above $T_{g1}$ in order that it will remain stable during its lamination to the upper sublayer 26 be stable at least 100° C. above $T_{g1}$. By stable, we mean it has sufficient viscosity that it doesn't shift, stretch or otherwise change in an undesirable manner during the lamination step.

Upper sublayer 26 is preferably a thermoset film, for example, Kapton ® polyimide film which is sold by E. I. DuPont de Nemours. Other materials, including thermoplastics, which exhibit sufficient stability may also be used. The lower sublayer 24 is preferably ULTEM ® 1000 polyetherimide resin ($T_{g1} \approx 217°$ C.) available from General Electric Company and the chip adhesive 15 is preferably ULTEM ® 6000 polyetherimide resin ($T_{g2} \approx 235°$ C.) available from General Electric Company.

The patterned metallization layer 28 extends into contact with contact pads 18 and conductor runs 13, if any, on the substrate 12 within via holes 23 in the dielectric layer 22.

A second layer 30 of the high density interconnect structure comprises a second dielectric layer 32 and a second patterned metallization layer 38. The dielectric layer 32 comprises a thermoplastic release layer 34R and separate lower and upper sublayers 34 and 36, respectively. The release layer may preferably be SPI siloxane polyimide. This release layer is included in the structure to ensure its repairability in the event that one of the electronic components or the interconnection structure itself should turn out to be faulty. In the event that this structure must be disassembled for repair, it is heated to above $T_{g1}$ so that the high density interconnect structure can be peeled off the substrate and electronic components. However, if it is not heated to a temperature at which the adhesive layer 34 is fluid, peeling the high density interconnect structure off in the absence of this release layer would result in the formation of divots in the contact pads and the underlying semiconductor material because of the strong grip the adhesive would provide on the metallization at the bottom of the via holes.

The second lower sublayer 34 is a thermoset material and is preferably a copolymer blend of a polyimide and a crosslinkable epoxy of the type disclosed in U.S. patent application Ser. No. 454,545, entitled "An Epoxy/Polyimide Copolymer Blend Dielectric and Layered Circuits Incorporating It", which is listed above. The polyimide of this copolymer blend may preferably be a siloxane polyimide which is fully reacted, such as siloxane polyimide SPI-129 or SPI-135 available from MicroSi. The crosslinkable epoxy of this copolymer blend may preferably be a cycloaliphatic epoxy such as Ciba Geigy ® CY179 (electronic grade) or Union Carbide ® ERL 4221 (electronic grade). Other epoxies may also be used.

This preferred composition is considered particularly advantageous because these materials exhibit high radiation resistance with the result that they will survive x-ray and gamma ray environments which the silicon semiconductor chips interconnected by the high density interconnect structure will not survive. Further, the resulting structure is highly stable. We have exposed these materials to 200° C. for 4000 to 5000 hours with no visible change in their characteristics.

The upper sublayer 36 may again be a thermoset material or a thermoplastic material and is preferably a thermoset material (Kapton). The patterned metallization 38 extends into via holes 33 in the dielectric layer 32 to make contact with the first metallization layer 28. If desired, selected via holes 33 may extend through dielectric layer 22 as well to provide direct contact to selected contact pads. However, that is not preferred because of the added processing complexity which results from having via holes of different depths and because of the adverse effect on repairability which results from having vias which connect directly to electronic component contact pads filled with a material which is still solid at temperatures in the 225° C. to 250° C. range.

A third layer of the high density interconnect structure 40 comprises a dielectric layer 42 and a patterned metallization layer 48. The dielectric layer 42 has separate lower and upper sublayers 44 and 46. The third lower sublayer 44 is preferably an SPI/epoxy crosslinking copolymer blend. The third upper dielectric sublayer 46 may again be a thermoset material or a thermoplastic material and is preferably a thermoset. No release sublayer is needed under lower sublayer 44.

In this structure, the SPI/epoxy crosslinking copolymer blend adhesive materials 34 and 44 are selected so that they become set at a low enough temperature that curing them has no adverse effect on the high density interconnect structure or the electronic components being connected thereby. This is in order that the structure may be fabricated and, if need be, disassembled without any adverse effect on the electronic components being interconnected, as taught in the background patents and applications. Thus, this invention involves the use of SPI/epoxy crosslinking copolymer blend adhesives which adhere well both to the underlying metallization and dielectric layers, provide good adhesion for the film to be laminated thereover and have a stable B-stage at which the lamination can be performed and which cure at a low enough temperature to avoid adverse effects on the rest of the high density interconnect structure. These adhesive materials are preferably inherently laser ablatable or should be rendered laser ablatable in accordance with U.S. patent application Ser. No. 456,421, entitled, "Laser Ablatable Polymer Dielectrics and Methods".

A variety of different adhesive materials are available and suitable for use in this structure. We prefer to use siloxane-polyimide/epoxy blends of the type disclosed in U.S. patent application Ser. No. 454,545, entitled "An Epoxy/Polyimide Copolymer Blend Dielectric and Layered Circuits Incorporating It", which is listed above. The use of this material as a spun-on dielectric layer is disclosed in that application. In accordance with this invention, the versatility and applicability of those blends is increased by using them as a planarization-/adhesive layer for the lamination of a preformed film. As taught in that application, varying the ratio of the SPI siloxane-polyimide to the epoxy changes the after-curing characteristics of the blend. For use with laser drilling at 351 nm, those blends which are predominantly epoxy should be modified by the addition of an ablation enabling dye as taught in U.S. patent application Ser. No. 456,421, entitled "Laser Ablatable Polymer Dielectrics and Methods", which is listed above. We have found that use of this crosslinking adhesive lamination process does not adversely affect the repairability of these high density interconnect structures when the release sublayer 34R is included in the structure. That release layer is not required if the SPI/epoxy crosslinking copolymer blend has a low enough $T_g$ that the high density interconnect structure can be heated to a temperature at which the SPI/epoxy crosslinking copolymer blend itself is sufficiently fluid that divot removal is not a problem during removal of the high density interconnect structure for repair purposes.

A preferred process 400 for producing the structure 10 shown in FIG. 3 is illustrated in FIG. 4.

The process 400 begins with Step 401 of mounting the chips on the substrate 12. This mounting may be intended to be permanent where the substrate will remain part of the completed structure or may be intended to be temporary where the substrate will be removed following completion of the fabrication process in order to provide a flexible high density interconnect structure. This mounting is preferably done with ULTEM 6000 resin as the thermoplastic adhesive at a lamination temperature in the 250° C. to 300° C. range.

In Step 402, the first upper sublayer 26 of dielectric material is coated with an appropriate thermoplastic adhesive 24 which is preferably ULTEM ® 1000 polyetherimide resin available from General Electric Company.

In Step 403, this first dielectric layer is laminated to the chips and substrate at a first lamination temperature $T_1$ which for Ultem 1000 is typically in the 250° to 300° C. range.

Next, in Step 404, the via holes 23 are formed in this first dielectric layer.

In Step 405, a patterned metallization layer 28 is formed on this first dielectric layer. This may be done by forming a uniform metallization layer and then patterning it or by directly forming a patterned metallization layer as taught in the above-listed patents or by any of a variety of other patterned-deposition or uniform-deposition-followed-by-patterning techniques. This step completes the fabrication of the first layer 20 of the high density interconnect structure, as illustrated in FIG. 3.

The fabrication of this structure to this point is in accordance with the teachings of the background patents listed above. The manner of arriving at this stage of the fabrication process is not crucial to the present invention and may be varied widely without departing from the present invention.

In Step 406, in accordance with the present invention, the thermoplastic release sublayer 34R which forms the first portion of the lower sublayer 34 is spun on on top of the first layer structure, that is, on top of the patterned metallization layer 28 and exposed portions of the first dielectric layer 22. This layer is then dried in a manner which is appropriate to that layer.

In Step 407, a SPI/epoxy crosslinking copolymer blend is coated on top of the release layer as an adhesive.

A copolymer blend of the polyimide and the crosslinkable epoxy source materials for this sublayer is formed to which a suitable curing agent for the epoxy is added, if needed. This material is then spin or spray coated on the release sublayer 34R in the process of forming the sublayer 34. A preferred source solution comprises a homogeneous blend of 200 grams of CY-179 cycloaliphatic epoxy resin from Ciba-Geigy and 472 grams of SPI-135 silicon polyimide polymer from MicroSi, 2.0 grams octyloxyphenyl (phenyl) iodonium hexafluoroantimonate catalyst from General Electric and 0.05 grams 12% copper naphthenate from Mooney Chemical. This 472 grams of SPI-135 consists of 175 grams of solids (37%) and 297 grams of diglyme/xylene solvent (63%). The solvent is 80% diglyme and 20% xylene. Solventless deposition may also be used as taught in U.S. patent application Ser. No. 454,545, entitled "An Epoxy/Polyimide Copolymer Blend Dielectric and Layered Circuits Incorporating It".

Following application of this liquid layer, this epoxy/polyimide copolymer blend layer is dried in Step 408 by heating the structure on a hot plate, or by other means, to a temperature $T_2$ of about 135° C. to drive off the solvent. We prefer to weigh the part before application of this source solution and then weigh it again after application of the source solution to determine the total SPI/epoxy/solvent weight present. When this source solution is spun on at 2600 rpm on a 2×2 inch substrate, approximately 70 milligrams of the solution is left evenly coated on the part. We then weigh the part every 30 minutes or so to determine the weight loss. We stop the drying process when the film has lost 47% of its weight.

FIG. 5 is a graph of the weight loss with time of a sample of this preferred source solution spun-on a substrate and dried in this manner. It will be observed that initially the solvent evaporates from the layer until the solvent is all gone. Then evaporation continues with the epoxy evaporating at the same time that it is curing. If this process is allowed to go to completion on a hot plate in this manner, then the final composition of the SPI/epoxy blend is about 63 wt % SPI and 37 wt % epoxy. We prefer to stop this drying process when about 10% of the epoxy has evaporated in order to be sure that all of the solvent is gone while still retaining most of the epoxy in the blend for a final composition of about 50:50 SPI:epoxy. We then remove the part from the hot plate and allow it to cool to room temperature. At this stage (at room temperature) the SPI/epoxy blend is no longer tacky and can be handled with ease and is generally about 12 μm thick. It is important to avoid curing this copolymer blend too far during this drying process, since that would result in poor adhesion between the laminated upper sublayer 36 and this adhesive lower sublayer 34 during lamination and would also result in void formation during the lamination process because the SPI/epoxy would not flow adequately during the lamination process to fill-in all depressions and other potential gaps between the Kapton upper sublayer film and this SPI/epoxy copolymer blend adhesive.

In Step 409, we pretreat the underside of the upper (KAPTON) sublayer by reactive ion etching (RIE) in preparation for lamination to the SPI/epoxy blend adhesive in order to promote the creation of a strong bond between the SPI/epoxy blend and that upper sublayer.

In Step 410, we place the part in the laminator at 80° C., apply vacuum to the top and bottom sides of the upper sublayer 36 to remove gases. After a sufficient evacuation time to obtain a base vacuum of 100 mTorr (typically about 20 minutes), a hydrostatic pressure of about 30–45 psi of nitrogen is applied to the upper surface of sublayer 36 to press the upper sublayer against the lower sublayer 34 and to cause sufficient flow of the SPI/epoxy blend to fill-in any potential voids. We then ramp the temperature up to a lamination temperature $T_3$ of 180° C. while maintaining pressure and hold the part at 180° C. for 30 minutes to finish the curing of the SPI/epoxy blend. We then cool the part to below 100° C., release the pressure and remove the part from the laminator. During lamination, the presence of the upper sublayer film 36 prevents evaporation of the epoxy. No segregation of the epoxy at the SPI/epoxy-blend/upper-sublayer interface has been observed, that is, this SPI/epoxy blend remains homogeneous even after complete curing.

Those skilled in the epoxy arts will recognize that the curing time can be reduced by increasing the curing temperature and that the curing temperature can be reduced if the curing time is increased.

This curing/lamination temperature $T_3$ of 180° C. is comfortably below the $T_g$ of 217° C. of ULTEM 1000. As a consequence, the ULTEM 1000 adhesive sublayer 24 remains rigid throughout this lamination process. This prevents the breaking of via connections as a result of the lamination pressure pushing the ULTEM 1000 thermoplastic resin layer back away from the vias as happened in the prior art samples in which vias broke during subsequent lamination at temperatures above the $T_g$ of the thermoplastic sublayer 24.

Spinning on this lower sublayer results in a substantially uniform thickness of the SPI/epoxy blend being disposed across the entire surface of the part. This layer is typically about 12 $\mu$m thick when the metallization runs are thinner than that. For thicker metallization runs, the SPI/epoxy blend is preferably spun on at a slower speed to yield a thicker layer. The upper sublayer 36 (Kapton) is preferably about 25 $\mu$m thick. Since this upper sublayer is preformed, its thickness is closely controlled. As a result, the dielectric layer 32 would have a thickness which is substantially 37 $\mu$m with a variation which is the variation in the thickness of the sublayer 34. However, this thickness is decreased by about 5 $\mu$m during the two RIE processing steps to which the Kapton layer is exposed. The first of these is the adhesion promoting pretreatment with RIE which removes about 1 $\mu$m from the Kapton layer and the second is the post-via-drilling RIE clean-up etch designed to remove any ash or other remnants in the via holes following their drilling which removes about 4 $\mu$m. However, this process still provides a much more uniform, much more repeatable thickness than a purely spun-on dielectric layer. This is highly desirable for use in microwave systems in which transmission lines are formed in the high density interconnect structure, since such dielectric layer uniformity and repeatability is important to being able to design and fabricate such transmission lines with the desired impedances.

In Step 411, via holes are formed in this second dielectric layer.

In Step 412, a second patterned metallization layer 38 is formed on top of the second dielectric layer 32 using the same or a different metallization technique as was used for the first metallization layer, as may be desired. This completes the fabrication of the second layer 30 of a high density interconnect structure of FIG. 3.

Where a third layer 40 of the high density interconnect structure is desired, as shown in FIG. 3, the process continues in Step 412 with coating the existing structure (that is, the patterned metallization layer 38 and exposed portions of the dielectric layer 32) with a SPI/epoxy crosslinking copolymer blend adhesive in accordance with the present invention. No thermoplastic release layer is needed here, although one can be provided if desired.

In Step 414, this SPI/epoxy crosslinking copolymer blend adhesive is dried at the temperature $T_2$ (~135° C.).

In Step 415, the third upper dielectric sublayer 46 is pretreated and laminated to the top of the third SPI/epoxy crosslinking copolymer blend adhesive sublayer 44 at the lamination temperature $T_3$ (~180° C.).

In Step 416, via holes 43 are formed in the third dielectric layer 42.

In Step 417, a third patterned metallization layer 48 is formed on the third dielectric layer to complete the fabrication of the structure shown in FIG. 3. It will be recognized that additional layers of the high density interconnect structure may be fabricated in this same manner, if additional layers are needed or desired.

An advantage of this multiple lamination structure is that it provides an ability to fabricate and pretest individual, basic high density interconnect structures of a complex system independently of each other. After such pretesting, the pretested, basic high density interconnect structures which make up the larger system are placed in their appropriate relative positions as shown generally at 300 in FIG. 6. These basic high density interconnect structures 318 are then interconnected by an overall high density interconnect structure 310 in the form of a further laminated dielectric layer 322 which bridges the gaps between adjacent basic high density interconnect structures 318. Metallization runs 328 which interconnect these various basic high density interconnect structures 318 through via holes 323 are then formed on the dielectric layer 322. The individual basic high density interconnect structures 318 are preferably disposed in a carrier or substrate (not shown) during fabrication of the overall high density interconnect structure. That carrier or substrate may be retained in the final system as a support for the overall high density interconnect structure, including the basic high density interconnect structures 318. Alternatively, the carrier may be removed to leave the structure as shown. The overall high density interconnect structure 310 is sufficiently flexible that the basic high density interconnect structures can be stacked by folding the portions of the overall high density interconnect structure which are disposed between the basic high density interconnect structures over on themselves. This ability to fabricate this overall high density interconnect structure by laminating its dielectric layer 322 to the basic high density interconnect structures provides a further increase in the versatility of high density interconnect structures over the structure shown in the drawings in application Ser. No. 07/504,769, entitled, "A Flexible High Density Interconnect Structure and Flexibly Interconnected System" in which the individual high density interconnect structure substrates are interconnected by the high density interconnect structure which interconnects the chips of the individual substrates.

For the sake of repairability of the assembled structure, each of the adhesive layers should to remain flexible throughout the life of the structure in order to facilitate repair of the structure in the event that one of the electronic components or a portion of the interconnect structure should be found to be faulty. Such flexibility facilitates peeling of the entire high density interconnect structure off the chips and substrate by heating above the $T_{g1}$ of the thermoplastic sublayer 24 in the manner taught in U.S. Pat. No. 4,878,991, entitled "Simplified Method for Repair of High Density Interconnect Circuits", listed above and above the $T_g$ of the release sublayer 34R to prevent divot removal from contact pads.

While in FIG. 3 the structure is illustrated as including a substrate 12, it should be understood that in accordance with application Ser. No. 250,010, entitled, "High Density Interconnect With High Volumetric Efficiency" and application Ser. No. 07/504,769, entitled, "A Flexible High Density Interconnect Structure and Flexibly Interconnected System", the substrate may be removed following fabrication of the interconnect structure to leave the electronic components 16 bonded directly to the high density interconnect structure and otherwise unsupported.

As has been described, it is preferred at each lamination step to coat the existing structure with the SPI/epoxy crosslinking copolymer blend lower sublayer of the next dielectric layer in order to facilitate planarization of that layer, especially in those situations where the a particularly thick metallization layer is used. However, if desired, the SPI/epoxy crosslinking copolymer blend adhesive may be applied to the film of the upper sublayer instead. In that case, the adhesive layer should be thicker than the metallization runs it is to cover in order to avoid leaving voids in the structure adjacent those metallization runs.

It will be recognized that in any of these structures, a final, upper, spun-on dielectric layer may be used, either for insulation purposes only or to support a final metallization layer. This avoids many of those problems with spun-on layers which arise only when two or more spun-on layers are used. Alternatively, a final laminated layer may be used which does not have via holes formed therein and does not have a metallization layer formed thereon. These same materials may also be used for the fabrication of printed circuit boards.

While it is preferred to use the same adhesive for laminating each sublayer 34, 44, ..., different adhesives may be used if desired.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A high density interconnect structure comprising:
   a plurality of semiconductor chips each having contact pads on a first surface thereof;
   a first layer of dielectric material bonded to said semiconductor chips, said first layer of dielectric material comprising first lower and first upper sublayers, said first lower sublayer being thermoplastic and having a first glass transition temperature $T_{g1}$, said first upper sublayer being stable over a range of temperatures above said first glass transition temperature, said first layer of dielectric material having via holes therein disposed in alignment with at least some of said contact pads;
   a patterned first metallization layer disposed on said first layer of dielectric material and extending into contact with at least some of said contact pads in said via holes in said first layer of dielectric material; and
   a second layer of dielectric material bonded to said first metallization layer and exposed portions of said first layer of dielectric material, said second layer of dielectric material comprising second lower and second upper sublayers, said second lower sublayer being a thermosetting polymer which can be cured at a temperature which is lower than $T_{g1}$, said second upper sublayer being stable over a range of temperatures above the minimum curing temperature of said thermosetting polymer.

2. The high density interconnect structure recited in claim 1 further comprising:
   a thermoplastic release layer disposed between said second lower sublayer and said first metallization and first dielectric layers.

3. The high density interconnect structure recited in claim 1 wherein:
   said second layer of dielectric material has via holes therein disposed in alignment with at least some portions of said first metallization layer; and said high density interconnect structure further comprises:
   a patterned second metallization layer disposed on said second layer of dielectric material and extending into contact with at least some portions of said first metallization layer in said via holes in said second layer of dielectric material.

4. The high density interconnect structure recited in claim 3 further comprising:
   a third layer of dielectric material bonded to said second metallization layer and exposed portions of said second layer of dielectric material, said third layer of dielectric material comprising third lower and third upper sublayers, said third lower sublayer being a thermosetting polymer which can be cured at a temperature which is lower than $T_{g1}$, said third upper sublayer being stable over a range of temperatures above the minimum curing temperature of said thermosetting polymer.

5. The high density interconnect structure recited in claim 4 wherein:
   said third layer of dielectric material has via portions of said second metallization layer; and
   said high density interconnect structure further comprises:
   a patterned third metallization layer disposed on said third layer of dielectric material and extending into contact with portions of said second metallization layer in said via holes in said third layer of dielectric material.

6. The high density interconnect structure recited in claim 1 wherein:
said first and second upper sublayers are thermoset polymers.

7. The high density interconnect structure recited in claim 6 wherein:
said first and second upper sublayers are thermoset polyimide.

8. The high density interconnect structure recited in claim 6 wherein:
said first lower sublayer, comprises polyetherimide; and
said second lower sublayer comprises a siloxanepolyimide/epoxy copolymer blend.

9. The high density interconnect structure recited in claim 1 further comprising:
a second high density interconnect structure;
an overall high density interconnect structure bonded to said second high density interconnect structure and the first recited high density interconnect structure, said overall high density interconnect structure comprising a first overall dielectric layer laminated to said first and second high density interconnect structures, said first overall dielectric layer having via holes therein in alignment with selected conductors of said first and second high density interconnect structure and a first overall metallization layer disposed on said first overall dielectric layer and extending into said via holes into electrical contact with selected ones of the conductors of said first and second high density interconnect structures.

10. The high density interconnect structure recited in claim 1 wherein:
at least one of said upper sublayers is thermoplastic.

11. The high density interconnect structure recited in claim 10 wherein:
said first and second upper sublayers are thermoplastic.

12. In a method of fabricating a high density interconnected system of the type including a plurality of electronic chips, a high density interconnect structure including a layer of dielectric material bonded to said chips and a pattern of conductors disposed on or in said dielectric material, the conductors of said high density interconnect structure electrically interconnecting said electronic chips, the improvement comprising:
a) providing a basic structure comprising said electronic chips, a first dielectric layer bonded to said chips, said first dielectric layer having a plurality of via holes therein and a patterned first metallization layer disposed thereon, said first metallization layer including conductors which extend into ohmic contact with contact pads in said via holes;
b) disposing a release layer in said via holes over said first metallization layer; and
c) laminating a second dielectric layer over said release layer using a crosslinking polymer adhesive which can be cured at a temperature at which said basic structure is stable, said second upper sublayer being stable over a range of temperatures above the minimum curing temperature of said crosslinking polymer, this laminating step being performed at a low enough temperature that said first dielectric layer remains fixed, whereby said first metallization layer and its contacts to said contact pads are not adversely affected by this laminating step.

13. The improvement recited in claim 12 further comprising the steps of:
d) forming second layer via holes in said second dielectric layer and said second adhesive in alignment with said contact pads and/or said first metallization layer; and
e) forming a patterned second metallization layer on said second dielectric layer, said second metallization layer including conductors which extend into ohmic contact with conductors of said first metallization layer and/or said contact pads in said second layer via holes.

14. The improvement recited in claim 13 further comprising the step of:
f) laminating a third dielectric layer to said second metallization layer and exposed portions of said second dielectric layer using a third thermosetting polymer which can be cured at a temperature which is lower than $T_{g1}$, said third upper sublayer being stable over a range of temperatures above the minimum curing temperature of said thermosetting polymer, said laminating step being performed at a low enough temperature that said first and second dielectric layers remain fixed, whereby said second metallization layer and its contacts to said contact pads and/or said first metallization layer are not adversely affected by this laminating step and said first metallization layer and its contacts to said contact pads are not adversely affected by this laminating step.

15. The improvement recited in claim 13 further comprising the steps of:
f) forming second layer via holes in said second dielectric layer and said second adhesive in alignment with portions of said first metallization layer; and
g) forming a patterned second metallization layer on said second dielectric layer, said second metallization layer including conductors which extend into ohmic contact with conductors of said first metallization layer in said second layer via holes.

16. The improvement recited in claim 15 further comprising the step of:
h) laminating a third dielectric layer to said second metallization layer and exposed portions of said second dielectric layer using a third thermosetting polymer which can be cured at a temperature which is lower than $T_{g1}$, said third upper sublayer being stable over a range of temperatures above the minimum curing temperature of said thermosetting polymer, this laminating step being performed at a low enough temperature that said first and second dielectric layers remain fixed, whereby said second metallization layer and its contacts to said first metallization layer are not adversely affected by this laminating step and said first metallization layer and its contacts to said contact pads are not adversely affected by this laminating step.

17. In a method of fabricating a high density interconnected system of the type including a plurality of electronic chips, a high density interconnect structure including a layer of dielectric material bonded to said chips and a pattern of conductors disposed on or in said dielectric material, the conductors of said high density interconnect structure electrically interconnecting said electronic chips, the improvement comprising:

a) laminating a first dielectric layer to said chips using a first thermoplastic adhesive having a first glass transition temperature $T_{g1}$;
b) forming via holes in said first dielectric layer and said first adhesive in alignment with at least some contact pads of said chips;
c) forming a patterned first metallization layer on said first dielectric layer, said first metallization layer including conductors which extend into ohmic contact with contact pads in said via holes;
d) disposing a release layer in said via holes over said first metallization layer;
e) laminating a second dielectric layer over said release layer using a crosslinking polymer adhesive which can be cured at a temperature at which said basic structure is stable, said second upper sublayer being stable over a range of temperatures above the minimum curing temperature of said thermosetting polymer, this laminating step being performed at a low enough temperature that said first dielectric layer remains fixed, whereby said first metallization layer and its contacts to said contact pads are not adversely affected by this laminating step.

18. The improvement recited in claim 17 wherein said laminating step comprises:
   forming a layer of said crosslinking adhesive over layer;
   drying said layer of crosslinking adhesive;
   laminating a preformed film of dielectric material to said structure using said crosslinking adhesive as the adhesive for that film.

19. A printed circuit board comprising:
   a first thermoset dielectric film;
   a first metallization layer disposed on said first thermoset dielectric film;
   a second thermoset dielectric film bonded to said first metallization layer and said first thermoset dielectric film by a SPI/epoxy crosslinking copolymer blend.

* * * * *